(12) United States Patent
Adam et al.

(10) Patent No.: US 9,093,260 B2
(45) Date of Patent: Jul. 28, 2015

(54) THIN HETEREOSTRUCTURE CHANNEL DEVICE

(75) Inventors: Thomas N. Adam, Slingerlands, NY (US); Kangguo Cheng, Guilderland, NY (US); Hong He, Schenectady, NY (US); Ali Khakifirooz, Slingerlands, NY (US); Alexander Reznicek, Mount Kisco, NY (US)

(73) Assignee: International Business Machines Corporation, Armonk, NY (US)

(*) Notice: Subject to any disclaimer, the term of this patent is extended or adjusted under 35 U.S.C. 154(b) by 179 days.

(21) Appl. No.: 13/607,875

(22) Filed: Sep. 10, 2012

(65) Prior Publication Data

US 2013/0161694 A1 Jun. 27, 2013

Related U.S. Application Data

(63) Continuation of application No. 13/336,251, filed on Dec. 23, 2011.

(51) Int. Cl.
| | |
|---|---|
| H01L 29/66 | (2006.01) |
| H01L 21/02 | (2006.01) |
| H01L 21/8238 | (2006.01) |
| H01L 21/84 | (2006.01) |
| H01L 27/12 | (2006.01) |
| H01L 21/3065 | (2006.01) |
| H01L 29/10 | (2006.01) |

(52) U.S. Cl.
CPC ...... *H01L 21/02057* (2013.01); *H01L 21/3065* (2013.01); *H01L 21/823807* (2013.01); *H01L 21/823821* (2013.01); *H01L 21/845* (2013.01); *H01L 27/1211* (2013.01); *H01L 29/1054* (2013.01); *H01L 21/0262* (2013.01); *H01L 21/02532* (2013.01)

(58) Field of Classification Search
CPC .............. H01L 21/823807; H01L 21/823821; H01L 21/845; H01L 27/1211; H01L 29/1054
USPC .................. 257/192, 369, E21.409, E21.632, 257/E27.062
See application file for complete search history.

(56) References Cited

U.S. PATENT DOCUMENTS

| | | | |
|---|---|---|---|
| 5,426,069 A | 6/1995 | Selvakumar et al. |
| 5,461,250 A | 10/1995 | Burghartz et al. |
| 6,713,779 B2 | 3/2004 | Tezuka et al. |
| 7,648,868 B2 | 1/2010 | Majumdar et al. |

(Continued)

OTHER PUBLICATIONS

International Search Report and Written Opinion dated Feb. 7, 2013 issued in PCT/US2012/66928.

(Continued)

*Primary Examiner* — Vongsavanh Sengdara
(74) *Attorney, Agent, or Firm* — Scully, Scott, Murphy & Presser, P.C.; Daniel P. Morris, Esq.

(57) ABSTRACT

A method of fabricating a semiconductor device that includes providing a substrate having at least a first semiconductor layer atop a dielectric layer, wherein the first semiconductor layer has a first thickness of less than 10 nm. The first semiconductor layer is etched with a halide based gas at a temperature of less than 675° C. to a second thickness that is less than the first thickness. A second semiconductor layer is epitaxially formed on an etched surface of the first semiconductor layer. A gate structure is formed directly on the second semiconductor layer. A source region and a drain region is formed on opposing sides of the gate structure.

10 Claims, 4 Drawing Sheets

(56) References Cited

U.S. PATENT DOCUMENTS

| | | | |
|---|---|---|---|
| 8,008,138 B2 | 8/2011 | Cheng et al. | |
| 2004/0136866 A1 | 7/2004 | Pontis et al. | |
| 2004/0197975 A1* | 10/2004 | Krivokapic et al. | 438/200 |
| 2005/0148161 A1 | 7/2005 | Chen et al. | |
| 2006/0166416 A1 | 7/2006 | Dalton et al. | |
| 2008/0054364 A1 | 3/2008 | Hokazono | |
| 2008/0135886 A1 | 6/2008 | Irisawa et al. | |
| 2008/0191286 A1 | 8/2008 | Chang et al. | |
| 2010/0184260 A1 | 7/2010 | Luo et al. | |
| 2010/0200937 A1 | 8/2010 | Bedell et al. | |
| 2010/0203737 A1 | 8/2010 | Morikawa et al. | |
| 2011/0042744 A1 | 2/2011 | Cheng et al. | |
| 2011/0086475 A1 | 4/2011 | Yamazaki et al. | |
| 2011/0147840 A1* | 6/2011 | Cea et al. | 257/347 |
| 2011/0159668 A1 | 6/2011 | Dhumal et al. | |
| 2011/0227157 A1 | 9/2011 | Yang et al. | |
| 2011/0248348 A1* | 10/2011 | Gan et al. | 257/369 |
| 2012/0074386 A1* | 3/2012 | Rachmady et al. | 257/24 |
| 2012/0091538 A1* | 4/2012 | Lin et al. | 257/401 |
| 2012/0261754 A1 | 10/2012 | Cheng et al. | |

OTHER PUBLICATIONS

K. Cheng et al., "Fully depleted extremely thin SOI technology fabricated by a novel integration scheme featuring implant-free, zero-silicon-loss, and faceted raised source/drain," 2009 Symposium on VLSI Technology, Jun. 16-18, 2009, pp. pp. 212-213.

K. Cheng et al., "Extremely thin SOI(ETSOI) CMOS with record low variability for low power system-on-chip applications," 2009 IEEE International Electron Devices Meeting (IEDM), Dec. 7-9, 2009, 4 pages.

M. Kim et al., Increased critical thickness for high Ge-content strained SiGe-on-Si using selective epitaxial growth, Appl. Phys. Lett., vol. 97, Issue 26, 2010, pp. 262106-1-262106-3. Dec. 27, 2010.

S. Baudot et al., "Fully Depleted Strained Silicon-on-Insulator p-MOSFETs With Recessed and Embedded Silicon-Germanium Source/Drain," IEEE Electron Device Letters, vol. 31, Issue:10, Oct. 2010, Date of Publication: Aug. 23, 2010, pp. 1074-1076.

Office Action dated Jul. 24, 2014 received in U.S. Appl. No. 13/336,251.

Final Office Action dated Jan. 26, 2015 received in U.S. Appl. No. 13/336,251.

* cited by examiner

THIN HETEROSTRUCTURE CHANNEL DEVICE

CROSS REFERENCE TO RELATED APPLICATION

This application is a continuation of U.S. patent application Ser. No. 13/336,251, filed Dec. 23, 2011, the entire content and disclosure of which is incorporated herein by reference.

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Typically, all dimensions of the device must be scaled simultaneously in order to optimize the electrical performance of the device.

SUMMARY

A method of fabricating a semiconductor device is provided that, in one embodiment, may begin with providing a substrate comprising at least a first semiconductor layer atop a dielectric layer, in which the first semiconductor layer is comprised of a first semiconductor material and has a first thickness of less than 10 nm. The first semiconductor layer may be etched with a halide based gas at a temperature of less than 675° C. to a second thickness that is less than the first thickness. A second semiconductor layer may be epitaxially formed on the etched surface of the first semiconductor layer. A gate structure can be formed directly on the second semiconductor layer, and source regions and drain regions may be formed on opposing sides of the gate structure.

In another aspect of the present disclosure, a complementary metal oxide semiconductor (CMOS) device is provided that includes a substrate having a first device region and a second device region. In one embodiment, the first device region includes a first thickness silicon layer that is present on a first portion of a buried insulating layer. In one embodiment, the second device region includes a silicon germanium layer on a second thickness silicon layer, wherein the second thickness silicon layer is present on a second portion of the buried insulating layer. The second thickness silicon layer has a lesser thickness than the first thickness silicon layer. A planar n-type semiconductor device may be present in the first device region of the substrate, and a planar p-type semiconductor device may be present in the second device region of the substrate.

In yet another aspect of the present disclosure, a method of forming a fin field effect transistor (finFET) is provided. In one embodiment, the method of forming the finFET includes providing at least one fin structure having a width of less than 20 nm, wherein the at least one fin structure is composed of a first semiconductor material. The at least one fin structure is then etched with a halide based gas at a temperature of less than 675° C. to a second width that is less than the first width of the at least one fin structure. A second semiconductor material is epitaxially formed on an etched surface of the at least one fin structure. A gate structure is formed atop a portion of the second semiconductor material. Source and drain regions may be formed on the exposed sidewalls of the second semiconductor material that is present on the fin structure on each side of the gate structure.

In a further aspect of the present disclosure, a fin field effect transistor (finFET) is provided that includes a fin structure of a first semiconductor material having a width ranging from 1.0 nm to 5.0 nm. A second semiconductor material is present on an upper surface and sidewalls of the fin structure. The second semiconductor material is a conformal epitaxial material having a thickness ranging from 1 nm to 10 nm. A gate structure is present on a portion of the second semiconductor material that is overlying the fin structure, and source and drain regions are present on opposing sides of the gate structure.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Figure 1:
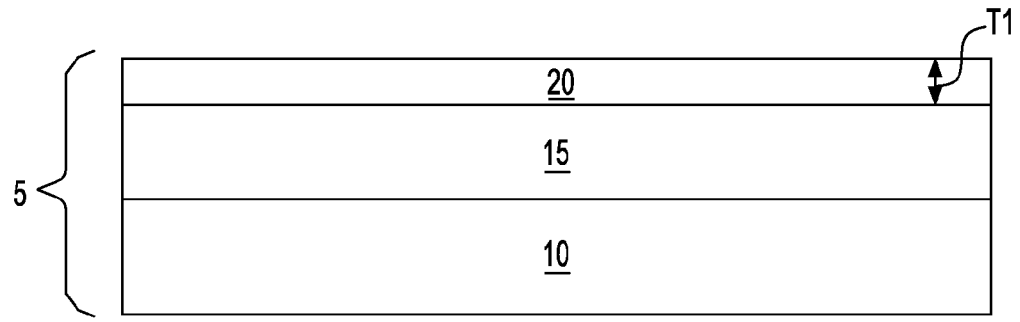
FIG. 1 is a side cross-sectional view depicting providing a substrate comprising at least a first semiconductor layer atop a dielectric layer, wherein the first semiconductor layer has a thickness of less than 10 nm, as used in one embodiment of a method for forming a planar semiconductor device, in accordance with the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the present disclosure provides methods for forming a semiconductor device including an epitaxially deposited semiconductor layer on a low defect extremely thin semiconductor on insulator (ETSOI) layer. The term "ETSOI layer" denotes a SOI semiconductor layer having a thickness of 5 nm or less. The SOI layer may be a semiconductor layer present on the dielectric layer of a semiconductor on insulator (SOI) substrate. It has been determined that exposing an ETSOI layer to high temperatures, such as the temperatures employed to clean semiconductor materials prior to epitaxial growth thereon, can agglomerate the ETSOI layer. In some embodiments, the methods disclosed herein provide a heterostructure channel including an epitaxially grown semiconductor material on a low defect ETSOI layer by cleaning the SOI layer prior to etching to the ETSOI thickness, wherein following cleaning the SOI layer is thinned in an epitaxial deposition chamber using a halogen based etch gas. Following thinning of the SOI layer to the ETSOI thickness, the second semiconductor layer may be epitaxially grown on the etched surface. By cleaning the SOI layer with high temperature processing prior to thinning of the layer to the ETSOI thickness, the methods disclosed herein avoid agglomeration of the ETSOI layer and provide an ETSOI layer having a low defect density.

FIGS. 1-4 depict one embodiment of a method of forming a planar semiconductor device formed on a portion of a substrate 5 that is composed of a first semiconductor layer 20a having a thickness of less than 5 nm that is present on a buried insulating layer 15, and a second semiconductor layer 30 having a thickness of less than 5 nm that is present on the first semiconductor layer 20a. In some embodiments, the first semiconductor layer 20a is composed of a semiconductor material that is different than the semiconductor material of the second semiconductor layer 30.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In one embodiment, the semiconductor device is a field effect transistor.

As used herein a "field effect transistor" is a transistor in which output current, i.e., source-drain current, is controlled by the voltage applied to a gate structure. A field effect transistor has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields. The term "planar" as used to describe a semiconductor device denotes that the direction of charge carriers from the source region to the drain region of the semiconductor device is along a plane that is parallel to the upper surface of the substrate, wherein the gate structure is present on the upper surface of the substrate. Typically, in a planar device at least a portion of the source region and the drain region are present within the upper surface of the substrate.

FIG. 1 illustrates the results of the processing steps that produce a substrate 5, i.e., semiconductor on insulator (SOI) substrate, in which the substrate 5 comprises at least a first semiconductor layer 20 (also referred to as an ETSOI layer 20) overlying a dielectric layer 15, wherein the first semiconductor layer 20 has a thickness of less than 10 nm. A base semiconductor layer 10 may be present underlying the dielectric layer 15. In one embodiment, the first semiconductor layer 20 is composed of a first semiconductor material.

The first semiconductor material that provides the first semiconductor layer 20 may be any semiconducting material including, but not limited to Si, strained Si, SiC, SiGe, SiGeC, Si alloys, Ge, Ge alloys, GaAs, InAs, and InP, or any combination thereof. In one embodiment, the first semiconductor material is silicon. The first semiconductor layer 20 may be thinned to a desired thickness by planarization, grinding, wet etch, dry etch, oxidation followed by oxide etch, or any combination thereof. One method of thinning the first semiconductor layer 20 is to oxidize the Si by a thermal dry or wet oxidation process, and then wet etch the oxide layer using a hydrofluoric acid mixture. This process can be repeated to achieve the desired thickness. In one embodiment, the first semiconductor layer 20 has a first thickness T1 ranging from 5.0 nm to 15.0 nm. In another embodiment, the first semiconductor layer 20 has a first thickness T1 ranging from 7.5 nm to 12.5 nm. In one example, the first semiconductor layer 20 has a first thickness T1 of 10.0 nm. The base semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 10 may have the same or a different composition than the first semiconductor layer 20.

The dielectric layer 15 that may be present underlying the first semiconductor layer 20 and atop the base semiconductor layer 10 may be formed by implanting a high-energy dopant into a bulk semiconductor substrate and then annealing the structure to form a buried insulating layer, i.e., dielectric layer 15. In another embodiment, the dielectric layer 15 may be deposited or grown prior to the formation of the first semiconductor layer 20. In yet another embodiment, the substrate 5 may be formed using wafer-bonding techniques, where a bonded wafer pair is formed utilizing glue, adhesive polymer, or direct bonding.

Figure 2:
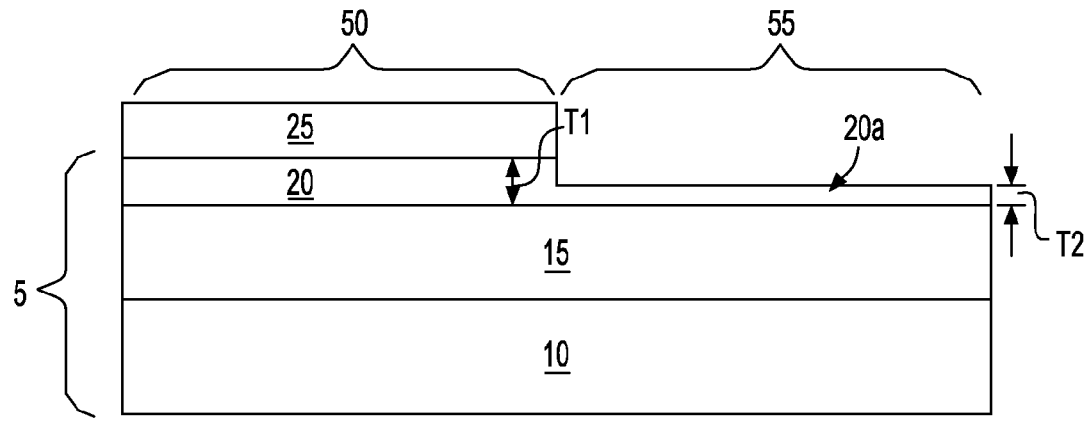
FIG. 2 is a side cross-sectional view depicting forming an etch mask over a first device region of the substrate and etching an exposed portion of the first semiconductor layer in a second device region, in accordance with one embodiment of the present disclosure.

FIG. 2 depicts one embodiment of forming a block mask 25 over a first device region 50 of the substrate 5 and etching an exposed portion of the first semiconductor layer 20a in a second device region 55 of the substrate 5. In one embodiment, the block mask 25 is formed protecting the portion of the substrate 5 in which the n-type semiconductor devices, e.g., nFETs, are subsequently formed. In some embodiment, the exposed portion of the substrate 5 that is not protected by the block mask 25 is subsequently processed to provide p-type semiconductor devices, e.g., pFET.

The block mask 25 may comprise soft and/or hardmask materials and can be formed using deposition, photolithography and etching. In one embodiment, the block mask 25 is a hardmask composed of a nitride-containing material, such as silicon nitride. It is noted that it is not intended that the block mask 25 be limited to only silicon nitride, as the composition of the hardmask may include any dielectric material that may be deposited by chemical vapor deposition (CVD) and related methods. Other hardmask compositions for the block mask 25 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

In one embodiment, a block mask 25 comprising a hardmask material may be formed by blanket depositing a layer of hardmask material, providing a patterned photoresist atop the layer of hardmask material, and then etching the layer of hardmask material to provide a block mask 25 protecting at least one portion of the substrate 5, e.g., the first device region 50 of the substrate 5. A patterned photoresist can be produced by applying a blanket photoresist layer to the surface of the substrate 5, exposing the photoresist layer to a pattern of radiation, and then developing the pattern into the photoresist layer utilizing resist developer. Etching of the exposed portion of the block mask 25 that is overlying the second device region 55 may include an etch chemistry for removing the exposed portion of the hardmask material and having a high selectivity to at least the block mask 25 and the first semiconductor layer 20 that is present in the second device region 55. In one embodiment, the etch process may be an anisotropic etch process, such as reactive ion etch (RIE).

In some embodiments, following the formation of the block mask 25, the exposed surface of the substrate 5, i.e., exposed portion of the first semiconductor layer 20a, is cleaned to remove any residual layers, foreign particles, and any residual metallic surface contamination. In one embodiment, the chemical cleaning process includes a first step of treating the exposed portion of the first semiconductor layer 20a with hydrofluoric acid (HF), a second step of treating the surface of the exposed portion of the first semiconductor layer 20a with a solution of ammonium hydroxide ($NH_4OH$) and hydrogen peroxide ($H_2O_2$), and a third step of treating the surface with an aqueous mixture of hydrochloric acid (HCl) and an oxidizing agent selected from the group consisting of hydrogen peroxide, ozone ($O_3$) and combinations thereof. The cleaning steps that include the application of the solution of ammonium hydroxide and hydrogen peroxide and the aqueous mixture of hydrochloric acid and the oxidizing agent may be provided by an RCA clean sequence.

In one embodiment and in the first step of the cleaning process, oxide material, such as silicon oxide or silicon oxynitride, is removed from the surface of the first semiconductor layer 20a of the substrate 5 by the application of a solution of hydrofluoric acid. Hydrofluoric acid is used to etch silicon oxide ($SiO_2$) films on silicon substrates, because the hydrofluoric acid will etch the silicon oxide without attacking the silicon surface. The hydrofluoric acid it typically diluted with deionized (DI) water in order to slow down the etch rate of the silicon oxide, thereby ensuring better etch uniformity. In one embodiment, the dilution ratio ranges from 1:1 HF:$H_2O$ to 300:1 $H_2O$:HF. In another embodiment, the hydrofluoric acid may be diluted with ammonium fluoride ($NH_4F$).

Following the surface treatment with hydrofluoric acid, the removal of particles and residual metallic contamination continues with an RCA clean process, which in some embodiments provides the second and third steps of the chemical cleaning process. In one embodiment, the RCA clean includes a treatment of the first semiconductor layer 20a of the substrate 5 in a solution of ammonium hydroxide and hydrogen peroxide followed by an aqueous mixture of hydrochloric acid and an oxidizing agent (e.g., $H_2O_2$, $O_3$).

The first step of the RCA clean that includes ammonium hydroxide and hydrogen peroxide may be referred to as "SC-1" (standard clean #1). SC-1 includes of a mixture of ammonium hydroxide and hydrogen peroxide and deionized water. A typical concentration ratio for the mix is 1:1:5 $NH_4OH$:$H_2O_2$:$H_2O$, although ratios as low as 0.05:1:5 are suitable for cleaning the substrate 5. SC-1 typically operates in a temperature ranging from 50° C. to 70° C.

The second step of the RCA clean that includes the aqueous mixture of hydrochloric acid and an oxidizing agent may be may be referred to as "SC-2" (standard clean #2). SC-2 includes a mixture of hydrochloric acid, hydrogen peroxide, and deionized water. A typical concentration ratio for the mix is 1:1:5 HCl:$H_2O_2$:$H_2O$. SC-2 is typically operated in the temperature range of 50-70° C.

In another embodiment, the chemical cleaning process is provided by a hydrofluoric acid last process. In this embodiment, oxide material, such as silicon oxide or silicon oxynitride, is removed from the first semiconductor layer 20a of the substrate 5 by the application of a solution of hydrofluoric acid. The hydrofluoric acid is typically diluted with deionized water in order to slow down the etch rate of the silicon oxide, thereby ensuring better etch uniformity. In one embodiment, the dilution ratio ranges from 1:1 $HF:H_2O$ to 300:1 $H_2O:HF$. In another embodiment, the hydrofluoric acid may be diluted with ammonium fluoride ($NH_4F$).

The above-described chemical cleaning processes may be applied to the first semiconductor layer 20a of the substrate 5 by methods such as immersion within a dip tank, brushing, spraying and combinations thereof. It is noted that the aforementioned methods of applying the chemical cleaning process have been provided for illustrative purposes only, and are not intended to limit the present disclosure. Any method of applying the chemical cleaning process to the first semiconductor layer 20a of substrate 5 may be employed.

The substrate 5 may then be positioned within an epitaxial deposition chamber. The epitaxial deposition chamber includes any chamber that may be employed in epitaxial deposition. For example, the epitaxial deposition chamber may include the deposition chamber of a chemical vapor deposition (CVD) apparatus. In some embodiments, once the substrate 5 is positioned within the epitaxial deposition chamber, the first semiconductor layer 20a of the substrate 5 may be treated with a hydrogen ($H_2$) containing gas at a pre-bake temperature. Typically, the hydrogen reduces the native oxide ($SiO_2$) containing oxygen from the surface of the first semiconductor layer 20a. In some embodiments, treating the surface of the first semiconductor layer 20a with a hydrogen containing gas at a pre-bake temperature provides an "oxygen-free" surface. By "oxygen-free" surface it is meant that the first semiconductor layer 20a of the substrate 5 is free of oxide. In one embodiment, the oxygen content of the surface of the first semiconductor layer 20a is less than 0.5%.

In one embodiment, the hydrogen containing gas is comprised of greater than 90% hydrogen ($H_2$). In another embodiment, the hydrogen containing gas is comprised of 100% hydrogen ($H_2$). It is noted that the hydrogen containing gas may include other elements, so long as the hydrogen containing gas does not provide a source of oxygen. In one embodiment, the hydrogen containing gas is applied at a pressure ranging from 10 Torr to 600 Torr.

The temperature of the hydrogen containing gas treatment is referred to as the "pre-bake temperature". In some embodiments, in which the first semiconductor layer 20a has not been chemically cleaned with a hydrofluoric acid last process, and there remains a native oxide, the pre-bake temperature of the hydrogen containing gas treatment may be greater than 700° C. For example, the pre-bake temperature of the hydrogen pre-bake process may be greater than 1000° C. In another example, the pre-bake temperature of the hydrogen containing gas treatment that follows the hydrofluoric acid last cleaning process may range from 1100° C. to 1200° C.

The time period for the treatment of the substrate 5 with the hydrogen containing gas may range from 15 seconds to 5 minutes. In another example, the time period for the treatment of the first semiconductor layer 20a of the substrate 5 with the hydrogen containing gas may range from 30 seconds to 2 minutes. The above time periods are provided for illustrative purposes only and are not intended to limit the present disclosure, as other time periods may be suitable for the treatment of the first semiconductor layer 20a of the substrate 5 with the hydrogen containing gas, so long as the time period by which the hydrogen containing gas is applied to the first semiconductor layer 20a is sufficient to provide a substantially oxygen-free surface.

In one embodiment, the hydrogen containing gas is flown across the first semiconductor layer 20a of the substrate 5 at a flow rate of 5000 sccm to 80000 sccm. In another embodiment, the hydrogen containing gas is flown across the first semiconductor layer 20a of the substrate 5 at a flow rate of 24000 sccm to 35000 sccm. It is noted that the above flow rates are provided for illustrative purposes only and may vary depending upon the configuration, e.g., size, of the epitaxial deposition chamber.

FIG. 2 further depicts etching an exposed portion of the first semiconductor layer 20a that is present in the second device region 55 to a second thickness T2 that is less than the first thickness T1, while the portion of the first semiconductor layer 20 that is present in the first device region 50 is protected by the block mask 25. In one embodiment, the exposed portion of the first semiconductor layer 20a is etched with a halide based gas at a temperature of less than 675° C. while the substrate 5 is present in an epitaxial deposition chamber. A "halide based gas" is a chemical compound of a halogen with a more electropositive element or group in a gaseous phase. Halogens or halogen elements are a series of nonmetal elements from Group 17 IUPAC Style (formerly: VII, VIIA) of the periodic table of elements and comprise fluorine (F), chlorine (Cl), bromine (Br), and iodine (I). Examples of halide based gasses that are suitable as an etchant for etching the exposed portion of the first semiconductor layer 20a include chlorine gas (Cl), hydrogen fluoride (HF), hydrogen chloride (HCl), hydrogen bromide (HBr) and combinations thereof.

In one embodiment, the halide based gas that etches the first semiconductor layer 20a in the second device region 55 of the substrate 5 further includes a carrier gas. For example, the carrier gas may be hydrogen ($H_2$), helium (He), argon (Ar) or nitrogen ($N_2$) gas. The carrier gas may comprise greater than 85% by volume of the halide based gas flow. In another embodiment, the carrier gas may comprise greater than 90% by volume of the halide based gas flow. In one embodiment, the gas flow is comprised of 90% by volume or greater of a carrier gas, such as hydrogen, 1% to 10% by volume of a halide based gas, such as hydrochloric acid (HCl).

In one embodiment, the halide based gas is applied to the exposed portion of the first semiconductor layer 20a that is present in the second device region 55 of the substrate 5 at a flow rate ranging from 10 sccm to 20 slm. In another embodiment, the halide based gas is applied to the exposed portion of the first semiconductor layer 20a that is present in the second device region 55 of the substrate 5 at a flow rate ranging from 100 sccm to 300 sccm. It is noted that the above flow rates are provided for illustrative purposes only and are not intended to limit the present disclosure.

The temperature of etching with the halide based gas is typically less than 675° C. In one embodiment, the etching of the exposed portion of the first semiconductor layer 20a in the second device region 55 may range from 500° C. to 650° C. In another embodiment, the etching of the exposed portion of the first semiconductor layer 20a in the second device region 55 may range from 550° C. to 600° C.

Following etching of the exposed portion of the first semiconductor layer 20a, the remaining portion of the first semiconductor layer 20a that is present in the second device region 55 has a second thickness T2 that ranges from 1 nm to 10 nm. In another embodiment, the remaining portion of the first semiconductor layer 20a has a second thickness T2 that ranges from 2 nm to 5 nm.

Figure 3:
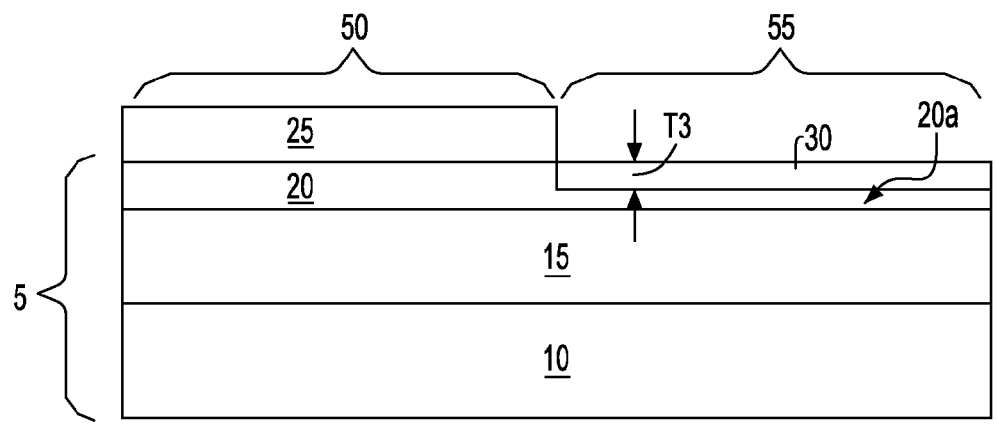
FIG. 3 is a side cross-sectional view depicting epitaxially forming a second semiconductor layer on the etched surface of the first semiconductor layer, in accordance with one embodiment of the present disclosure.

FIG. 3 depicts epitaxially forming a second semiconductor layer 30 on the etched surface of the first semiconductor layer 20a in the second device region 55 of the substrate 5. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, the depositing atoms have no surface to align to, resulting in the formation of polycrystalline or amorphous silicon instead of single crystal silicon. The temperature for epitaxial silicon deposition typically ranges from 550° C. to 900° C. Although higher temperature typically results in faster deposition, the faster deposition may result in crystal defects and film cracking.

In one embodiment, the epitaxially formed second semiconductor layer 30 may be composed of silicon-containing material. A number of different sources may be used for the deposition of epitaxial silicon. In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. The temperature for epitaxial silicon deposition typically ranges from 250° C. to 900° C. Although higher temperature typically results in faster deposition, the faster deposition may result in crystal defects and film cracking.

In another embodiment, the epitaxially formed second semiconductor layer 30 may be composed of germanium (Ge). A number of different sources may be used for the deposition of epitaxial germanium. In some embodiments, the germanium containing gas sources for epitaxial growth include germane ($GeH_4$), digermane ($Ge_2H_6$), halogermane, dichlorogermane, trichlorogermane, tetrachlorogermane and combinations thereof.

In yet another embodiment, the epitaxially formed second semiconductor layer 30 is composed of a germanium-containing material, such as silicon germanium (SiGe). A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 40%.

In an even further embodiment, the epitaxially formed second semiconductor layer 30 is composed of silicon doped with carbon (Si:C). The carbon (C) content of the epitaxial grown silicon doped with carbon may range from 0.3% to 5%, by atomic weight %. In another embodiment, the carbon content of the epitaxial grown silicon doped with carbon may range from 1% to 2%.

In one embodiment, the epitaxially formed second semiconductor layer 30 has a third thickness T3 ranging from 1 nm to 10 nm. In another embodiment, the second semiconductor layer 30 that is present in the second device region 55 has a third thickness T3 that ranges from 2 nm to 5 nm. In some examples, the upper surface of the epitaxially formed second semiconductor layer 30 in the second device region 55 is coplanar with the upper surface of the first semiconductor layer 20 that is present in the first device region 50. The epitaxially formed second semiconductor layer 30 may have a defect density of less than 100 $cm^{-2}$ with as close to zero defects being preferred.

Figure 4:
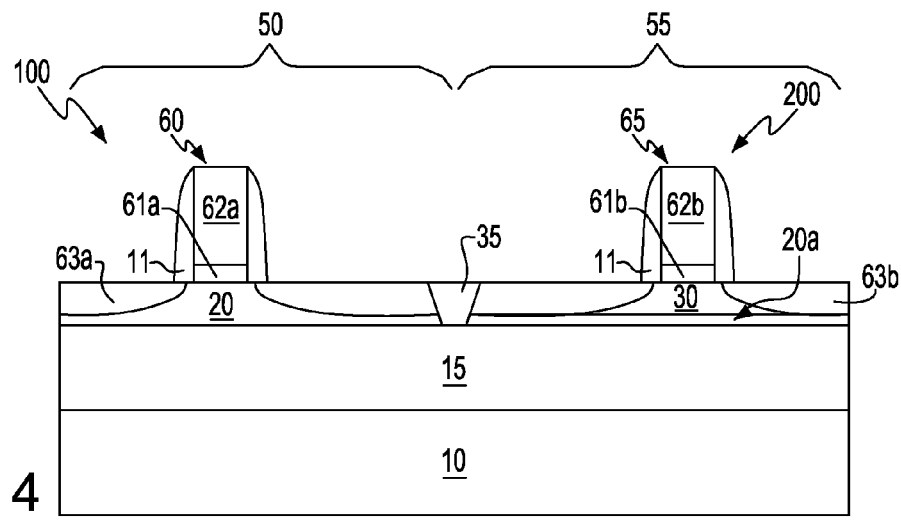
FIG. 4 is a side cross-sectional view depicting forming a gate structure in each of the first device region and the second device region, and forming source and drain regions on opposing sides of the gate structures, in accordance with one embodiment of the present disclosure.

FIG. 4 depicts forming a first gate structure 60 directly on the first semiconductor layer 20 in the first device region 50 of the substrate 5, and forming a second gate structure 65 on the second semiconductor layer 30 in the second device region 55. Each of the first gate structure 60 and the second gate structure 65 include at least one gate dielectric 61a, 61b that is present on a channel portion of the substrate 5, and at least one gate conductor 62a, 62b that is present on the at least one gate dielectric 61a, 61b. The gate conductors 62a, 62b may be composed of a doped semiconductor material, such as n-type doped polysilicon, or the gate conductors 62a, 62b may be composed of an elemental metal. When the gate conductors 62a, 62b are composed of an elemental metal, the gate conductors 62a, 62b may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The gate conductors 62a, 62b may be composed of a single material layer or may be a multi-layered structures. The gate conductors 62a, 62b may be composed of the same or a different material.

The gate dielectrics 61a, 61b may be composed of a dielectric material, such as $SiO_2$, or alternatively high-k dielectrics, such as oxides of Ta, Zr, Al or combinations thereof. In another embodiment, the gate dielectrics 61a, 61b are comprised of an oxide, such as $SiO_2$, $ZrO_2$, $Ta_2O_5$ or $Al_2O_3$. In one embodiment, each of the gate dielectrics 61a, 61b has a thickness ranging from 1 nm to 10 nm. In another embodiment, each of the gate dielectric 61a, 61b has a thickness ranging from 1.5 nm to 2.5 nm. The gate dielectrics 61a, 61b may be composed of the same or a different material.

Each of the gate structures 60, 65 may be formed using deposition, photolithography and a selective etching process. For example, the material layers that provide the gate dielectrics 61a, 61b and the gate conductors 62a, 62b may be deposited in the first device region 50 and the second device region 55 of the substrate 5. In one embodiment, the gate dielectrics 61a, 61b and gate conductors 62a, 62b may be formed using a deposition process, such as chemical vapor deposition (CVD) or physical vapor deposition (PVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In some embodiments, chemical vapor deposition (CVD)

may be employed to deposit the dielectric material of the gate dielectrics 61a, 61b. In some embodiments, CVD may also be employed to deposit the doped semiconductor material that provides the gate conductors 62a, 62b. In the embodiments, in which the gate conductors 62a, 62b are composed of a metal, the metal may be deposited using a physical vapor deposition (PVD) method, such as sputtering.

The material layers that provide the gate dielectrics 61a, 61b, and the gate conductors 62a, 62b, may then be patterned and etched to provide the first gate structure 60 and the second gate structure 65. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. Alternatively, the first and second gate structure 60, 65 can be formed by replacement gate technology.

Still referring to FIG. 4, source and drain regions 63a, 63b may be formed on opposing sides of the first and second gate structures 60, 65. The source and drain regions 63a that are present in the first device region 50 may be doped to an n-type conductivity when the first semiconductor layer 20 is composed of silicon, and the source and drain regions 63b that are present in the second device region 55 may be doped to a p-type conductivity when the second semiconductor layer 30 is silicon germanium. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. The dopant that dictates the conductivity type of the source and drain regions 63a, 63b may be introduced to the first and second device region 50, 55 using ion implantation. Each of the first and second device regions 50, 55 may be selectively processes using block masks, such as a photoresist block masks. In some embodiments, prior to forming the first and second drain region 50, 55, a set of spacers 11 can be formed in direct contact with the sidewalls of the gate structures 60, 65. The spacers 11 may be employed to dictate the positioning of the dopants being implanted into the substrate 5. In some embodiments, the first spacers 11 have a width ranging from 2.0 nm to 15.0 nm.

Referring to FIG. 4, the above process may provide a planar complementary metal oxide semiconductor (CMOS) device that includes a substrate 5 including a first device region 50 and a second device region 55. The first device region 50 may include a first thickness T1 silicon layer, i.e., first semiconductor layer 20, on a first portion of a buried insulating layer 15. The second device region 55 may include a silicon germanium layer, i.e., second semiconductor 30, on a silicon layer, i.e., etched portion of the first semiconductor layer 20a, having a second thickness T2. The second thickness T2 of silicon layer is present on a second portion of the buried insulating layer 15. The second thickness T2 of the silicon layer has a lesser thickness than the first thickness T1 of the silicon layer. A planar n-type semiconductor device 100, e.g., nFET, is present in the first device region 50 of the substrate 5, and a planar p-type semiconductor device 200, e.g., pFET, is present in the second device region 55 of the substrate 5. The n-type semicondcutor device 100 may be seperated from the p-type semiconductor device 200 by a trench isolation region 35.

In the embodiments, in which a p-type semiconductor device 200, e.g., pFET, is present overlying a second semiconductor layer 30 composed of silicon germanium that is in direct contact with an etched portion of a first semiconductor layer 20a composed of silicon, the silicon germanium material that provides the channel region of the device provides increased mobility, threshold voltage control and strain based performance enhancements. The combination of the silicon germanium second semiconductor layer 30 and the remaining portion of the silicon first semiconductor layer 20a that is underyling the gate structure 65 may be referred to as a heterostructure channel.

FIGS. 5-10 depict one embodiment of a method of fabricating a finFET semiconductor device 300 that may include providing at least one fin structure, e.g., a first fin structure 305a, having a first width W1 of less than 20 nm, and etching the at least one fin structure with a halide based gas at a temperature of less than 675° C. to a second width W2 that is less than the first width W1 of the at least one fin structure. The at least one fin structure may be composed of a first semiconductor material. A second semiconductor material 310 may then be epitaxially formed on an etched surface of the at least one fin structure. A gate structure 320 and source and drain regions may then be formed on the second semiconductor material 310 that is present on the at least one fin structure. In some embodiments, the at least one fin structure includes a first fin structure 305a having the second semiconductor material 310 present thereon, and a second fin structure 305b that is present on a second portion of the substrate that does not include the second semiconductor material. The details of this method are now discussed in greater detail.

Figure 5:
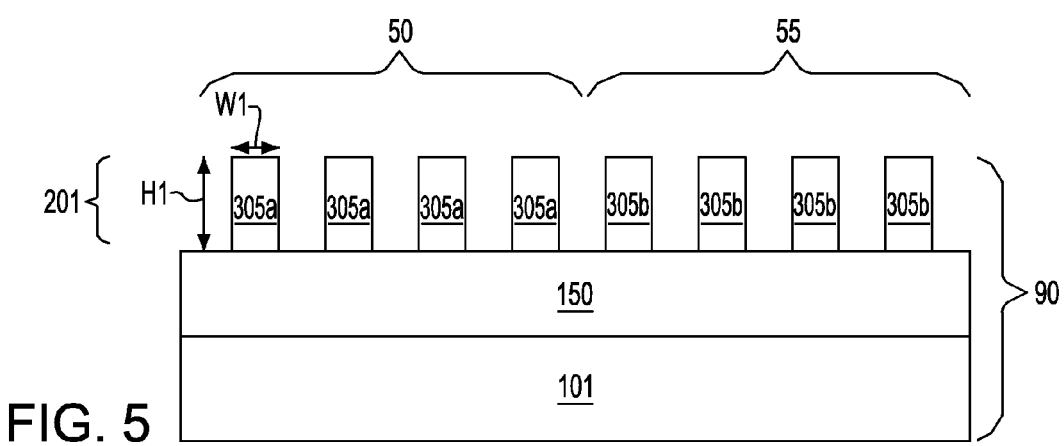
FIG. 5 is a side cross-sectional view depicting forming fin structures having a width of less than 20 nm, as used in one embodiment of a method for forming a finFETs device, in accordance with the present disclosure.

FIG. 5 depicts an initial structure used in one embodiment of a method for forming a finFET device. The initial structure may include at least one fin structure 305a, 305b present atop a dielectric layer 150. As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

In one embodiment, the fin structure 305a, 305b and the dielectric layer 150 may be provided from an SOI substrate 90, in which the top semiconductor layer of the SOI substrate 90 provides the fin structure 305a, 305b. The SOI substrate 90 typically includes a bottom semiconductor layer 101 and a top semiconductor layer 201 (also referred to as an SOI layer) that are electrically isolated from each other by a buried insulating layer (hereafter referred to as a dielectric layer 150). The SOI layer 200 and the bottom semiconductor layer 101 may comprise at least one of Si, Ge alloys, SiGe, GaAs, InAs, InP, SiCGe, SiC as well as other III/V or II/VI compound semiconductors. The SOI layer 200 and bottom semiconductor layer 101 may comprise the same or different materials. The dielectric layer 150 separating the SOI layer 201 and the bottom semiconductor layer 101 may be a crystalline or non-crystalline oxide, nitride, oxynitride, or any other insulating material. The thickness of the various layers of the SOI substrate 90 may vary depending on the technique used in forming the same. In one embodiment, the SOI layer 201 has a thickness ranging from 3 nm to 100 nm, the dielectric layer 150 (also referred to as buried dielectric layer) has a thickness ranging from 10 nm to 150 nm, and the thickness of the bottom semiconductor layer 101 of the SOI substrate 90 may range from 10 nm to 500 nm.

In one embodiment, prior to etching the SOI substrate 90 to provide the fin structure 305a, 305b, a layer of the dielectric material is deposited atop the SOI substrate 90 to provide a dielectric fin cap (not shown). The material layer that provides the dielectric fin cap may be composed of a nitride, oxide, oxynitride material, and/or any other suitable dielectric layer. The dielectric fin cap may comprise a single layer of dielectric material or multiple layers of dielectric materials. The material layer that provides the dielectric fin cap can be formed by a deposition process, such as chemical vapor deposition (CVD) and/or atomic layer deposition (ALD). Alternatively, the material layer that provides the dielectric fin cap may be formed using a growth process, such as thermal oxidation or thermal nitridation. The material layer that provides the dielectric fin cap may have a thickness ranging from 1 nm to 100 nm. In one example, the dielectric fin cap is composed of an oxide, such as $SiO_2$, that is formed by chemical vapor deposition to a thickness ranging from 25 nm to 50 nm. In yet another embodiment, no dielectric fin cap is present.

In one embodiment, following the formation of the layer of dielectric material that provides the dielectric fin cap, a photolithography and etch process sequence is applied to the material layer for the dielectric fin cap and the SOI substrate 90. Specifically, in one example, a photoresist mask is formed overlying the layer of the dielectric material that provides dielectric fin cap and is present overlying the SOI layer 201 of the SOI substrate 90, in which the portion of the dielectric material that is underlying the photoresist mask provides the dielectric fin cap, and the portion of the SOI layer 201 that is underlying the photoresist mask provides the fin structure 305a, 305b. The exposed portions of the dielectric material that provides dielectric fin cap and the SOI layer 201, which are not protected by the photoresist mask, are removed using a selective etch process. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, CVD, PECVD, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap followed by removing the unprotected portion of the SOI layer 201 selective to the underlying buried insulating layer, i.e., dielectric layer 150. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. When present, the dielectric fin cap may be removed following etching of the SOI layer 201 to form the fin structures 305a, 305b.

Each of the fin structures 305a, 305b may have a height $H_1$ ranging from 5 nm to 200 nm. In one embodiment, each of the fin structures 305a, 305b has a height $H_1$ ranging from 10 nm to 100 nm. In another embodiment, each of the fin structures 305a, 305b has a height $H_1$ ranging from 20 nm to 50 nm. In one embodiment, each of the fin structures 305a, 305b has a width $W_1$ of less than 20 nm. In another embodiment, each of the fin structures 305a, 305b has a width $W_1$ ranging from 3 nm to 8 nm. It is noted that any number of fin structures 305a, 305b may be formed.

Figure 6:
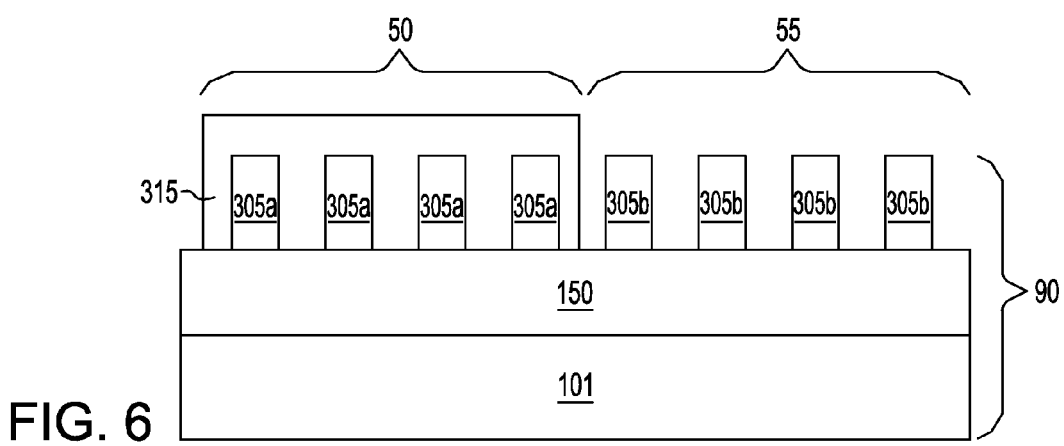
FIG. 6 is a side cross-sectional view depicting forming an etch mask over a first plurality of fin structures in a first device region of the substrate, wherein a second plurality of fin structures in a second device region of the substrate are exposed, in accordance with one embodiment of the present disclosure.

FIG. 6 depicts forming an etch mask 315 over a first plurality of fin structures 305a in a first device region 50 of the SOI substrate 90, wherein a second plurality of fin structures 305b in a second device region 55 of the SOI substrate 90 are exposed. The etch mask 315 that is depicted in FIG. 6 is similar to the etch mask 25 that is described above for protecting the first device region 50 of the substrate 5 that is depicted in FIG. 2. Therefore, the description of the etch mask 25 that is depicted in FIG. 2 is suitable for describing the etch mask 315 that is depicted in FIG. 6.

Figure 7:
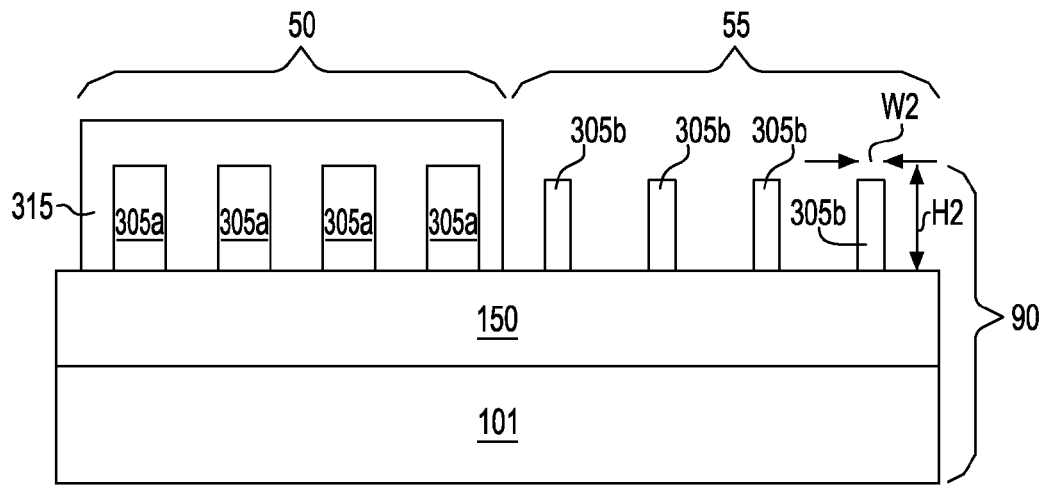
FIG. 7 is a side cross-sectional view depicting etching the second plurality of fin structures in a second device region to reduce the width of the second plurality of fin structures, in accordance with one embodiment of the present disclosure.

FIG. 7 depicts etching the second plurality of fin structures 305b in a second device region 55 to reduce the width of the second plurality of fin structures 305b. More specifically, the width of each of the second plurality of fin structures 305b may be reduced to a second width W2 ranging from 2 nm to 10 nm. In another embodiment, the width of each of the second plurality of fin structures 305b may be reduced to a second width W2 ranging from 3 nm to 6 nm. In yet another example, the width of each of the second plurality of fin structures 305b is reduced to a second width W2 ranging from 4 nm to 5 nm.

The etch process that reduces the width of the second plurality of fin structures 305b may be an isotropic etch process. Contrary, to an anisotropic etch process, an isotropic etch process is non-directional. Therefore, in some embodiments, the etch process that reduces the width of each of the second plurality of fin structures 305b also reduces the height of each of the second plurality of fin structures 305b. In some embodiments, the etch process that reduces the width of the second plurality of fin structures 305b, reduces the height of the second plurality of fin structures 305b to a second height H2 of less than 10 nm. In another embodiment, the etch process that reduces the width of the second plurality of fin structures 305b, reduces the height of the second plurality of fin structures 305b to a second height H2 ranging from 4 nm to 5 nm. Etching may also be done on fin structures 305a, 305b that have a hardmask still on the top portion of the fins, protecting them from attack. This structure is referred to as "dual gate" or "double gate" fin. The advantage is that height is not reduced during etching.

The etch process applied to the second plurality of fin structures 305b that is depicted in FIG. 7 is similar to the etch process that is described above for reducing the thickness of the first semiconductor layer 20 that is described above with reference to FIGS. 1 and 2. Therefore, the description of the etch process the reduces the thickness of the first semiconductor layer 20 that is depicted in FIG. 2 is suitable for describing the etch process that reduces the width of the second plurality of fin structures 305b that are depicted in FIG. 7. For example, following formation of the etch mask 315, the exposed portion of fin structures, e.g., second plurality of fin structures 305b, may cleaned to remove any residual layers, foreign particles, and any residual metallic surface contamination. The cleaning process has been described above with reference to FIG. 2.

Following the cleaning process, the SOI substrate 90 may then be positioned within an epitaxial deposition chamber. The epitaxial deposition chamber includes any chamber that may be employed in epitaxial deposition. For example, the epitaxial deposition chamber may include the deposition chamber of a chemical vapor deposition (CVD) apparatus. In some embodiments, once the SOI substrate 90 is positioned within the epitaxial deposition chamber, the second plurality of fin structures 305b may be treated with a hydrogen ($H_2$) containing gas at a pre-bake temperature. Typically, the hydrogen reduces the native oxide ($SiO_2$) containing oxygen from the second plurality of fin structures 305b.

In some embodiments, treating the second plurality of fin structures 305b with a hydrogen containing gas at a pre-bake temperature provides an "oxygen-free" surface. In one embodiment, the oxygen content of the surface of the second plurality of fin structures 305b is less than 0.5%. The details of the treatment of the second plurality of fin structures 305b with the hydrogen-containing gas at the pre-bake temperature have been describe above with reference to FIG. 2.

Referring to FIG. 7, the second plurality of fin structures 305b that is present in the second device region 55 are then etched to the second width W2, while the first plurality of fin structures 305a that are present in the first device region 50 are protected by the block mask 315. In one embodiment, the second plurality of fin structures 305b are etched with a halide based gas at a temperature of less than 675° C. while the SOI substrate 90 is present in an epitaxial deposition chamber. Examples of halide based gasses that are suitable as an etchant for etching the second plurality of fin structures 305b include chlorine gas (Cl), hydrogen fluoride (HF), hydrogen chloride (HCl), hydrogen bromide (HBr) and combinations thereof. In one embodiment, halide based gas that etches the second plurality of fin structures 305b of the SOI substrate 90 further includes a carrier gas. For example, the carrier gas may be hydrogen ($H_2$), helium (He), argon (Ar) or nitrogen ($N_2$) gas. The carrier gas may comprise greater than 85% by volume of the halide based gas flow. In another embodiment, the carrier gas may comprise greater than 90% by volume of the halide based gas flow. In one embodiment, the gas flow is comprised of 90% by volume or greater of a carrier gas, such as hydrogen, 1% to 10% by volume of a halide based gas, such as hydrochloric acid (HCl).

In one embodiment, the halide based gas is applied to the second plurality of fin structures 305b that are present in the second device region 55 of the substrate 5 at a flow rate ranging from 10 sccm to 20 slm. In another embodiment, the halide based gas is applied to the second plurality of fin structures 305b at a flow rate ranging from 100 sccm to 300 sccm. It is noted that the above flow rates are provided for illustrative purposes only and are not intended to limit the present disclosure.

The temperature of etching with the halide based gas is typically less than 675° C. In one embodiment, the etching of the second plurality of fin structures 305b may range from 500° C. to 650° C. In another embodiment, the etching of the second plurality of fin structures 305b may range from 550° C. to 600° C.

Figure 8:
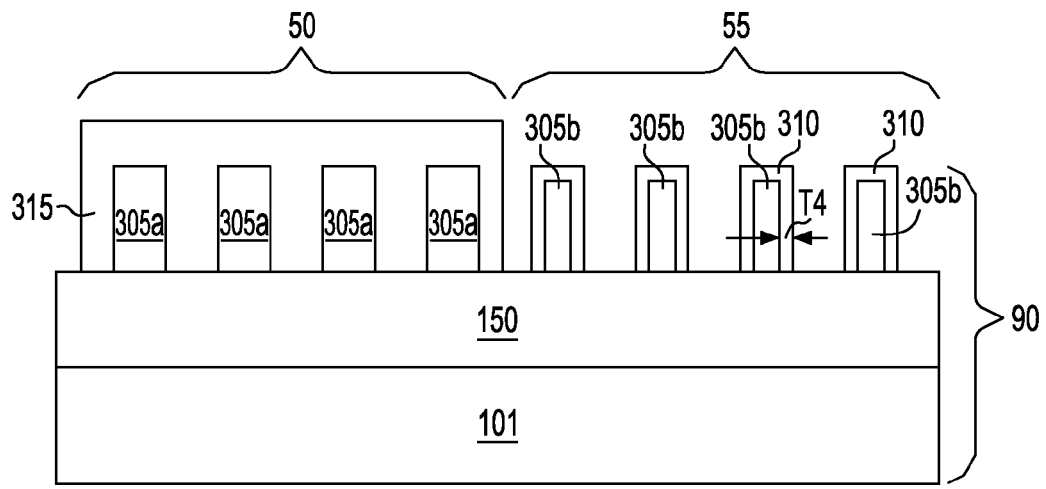
FIG. 8 is a side cross-sectional view depicting epitaxially forming a second semiconductor layer on the etched surface of the second plurality of fin structures in the second device region, in accordance with one embodiment of the present disclosure.

FIG. 8 depicts epitaxially forming a second semiconductor layer 310 on the etched surface of the second plurality of fin structures 305b. In one embodiment, the epitaxially formed second semiconductor layer 310 may be composed of silicon-containing material. A number of different sources may be used for the deposition of epitaxial silicon, such as the sources for depositing epitaxial silicon that have been described above with reference to FIG. 3. In another embodiment, the epitaxially formed second semiconductor layer 310 may be composed of germanium (Ge). In yet another embodiment, the epitaxially formed second semiconductor layer 310 is composed of a germanium-containing material, such as silicon germanium (SiGe). The germanium content of the epitaxial layer of silicon germanium may range from 5% to 70%, by atomic weight %. In another embodiment, the germanium content of the epitaxial layer of silicon germanium may range from 10% to 40%. In an even further embodiment, the epitaxially formed second semiconductor layer 310 is composed of silicon doped with carbon (Si:C). The carbon (C) content of the epitaxial grown silicon doped with carbon may range from 0.3% to 5%, by atomic weight %. In another embodiment, the carbon content of the epitaxial grown silicon doped with carbon may range from 1% to 2%. Sources for the epitaxial deposition of germanium, silicon germanium and silicon doped with carbon (Si:C) have been described above with reference to FIG. 2.

The epitaxially formed second semiconductor layer 310 may be conformally deposited on the sidewalls and upper surfaces, i.e., etched surfaces, of the second plurality of fin structures 305b. The term "conformal" denotes a layer having a thickness that does not deviate from greater than or less than 20% of an average value for the thickness of the layer. The term "conformally deposited" denotes a deposition method that forms a conformal layer. In one embodiment, the thickness of the epitaxially formed second semiconductor layer 310 on the sidewalls of the second plurality of fin structures 305b is the same as the thickness of the epitaxially formed second semiconductor layer 310 on the upper surface of the second plurality of fin structures 305b. In one embodiment, the epitaxially formed second semiconductor layer 310 has a thickness T4 ranging from 1 nm to 10 nm. In another embodiment, the second semiconductor layer 310 that is present in the second device region 55 has a thickness T4 that ranges from 2 nm to 5 nm. The epitaxially formed second semiconductor layer 310 may have a defect density of less than 100 $cm^{-2}$ with as close to zero defects being preferred.

Following epitaxial growth of the second semiconductor layer 310, the block mask 315 is removed.

Figure 9:
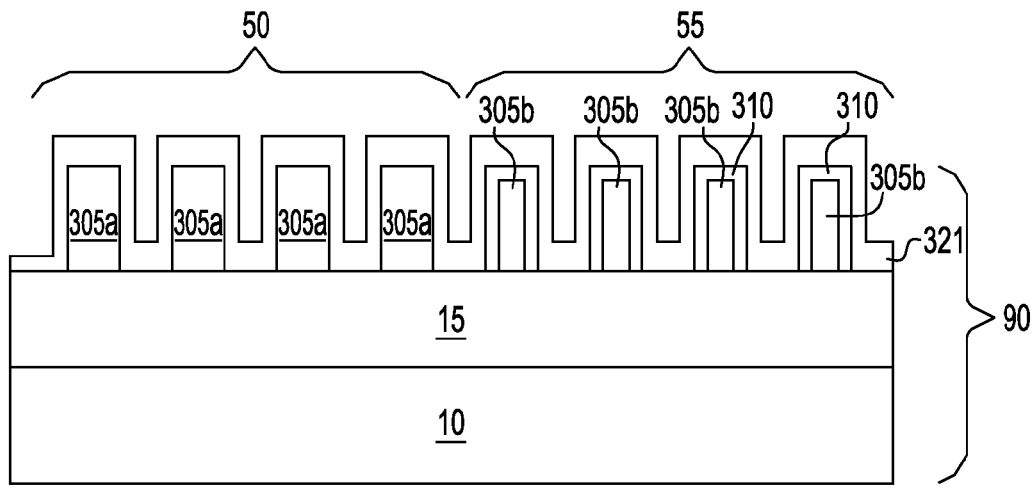
FIG. 9 is a side cross-sectional view depicting forming a gate dielectric on the first plurality of fin structures and the second plurality of fin structures, in accordance with one embodiment of the present disclosure.
Figure 10:
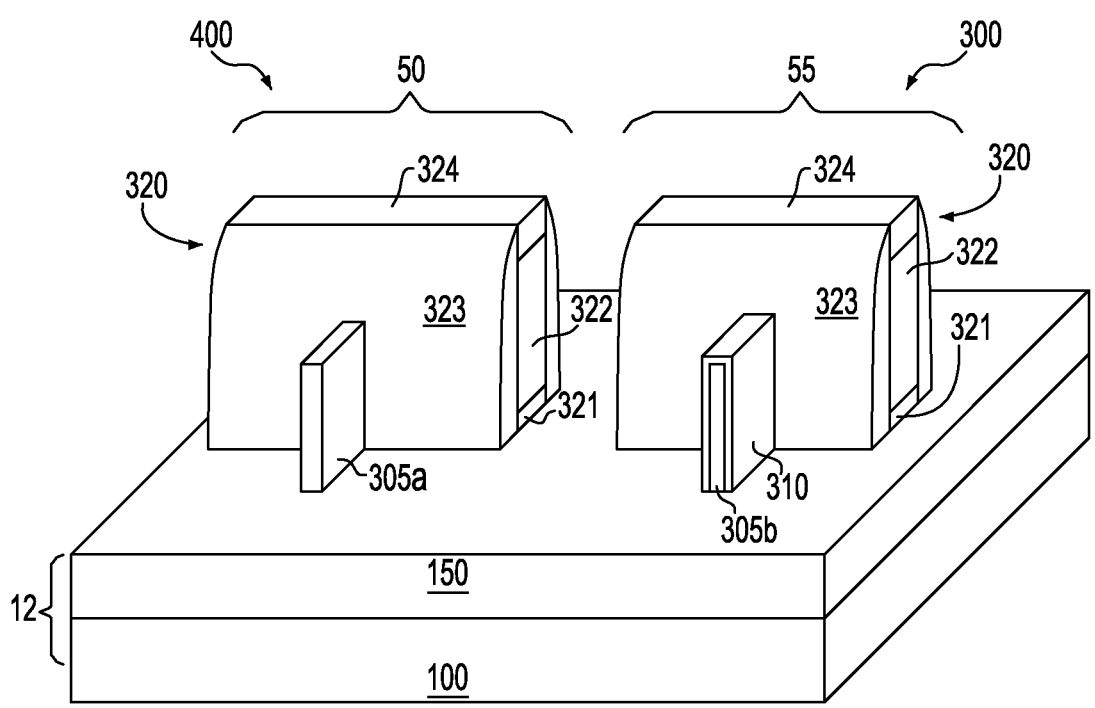
FIG. 10 is a perspective view depicting one embodiment of forming gate structures and source and drain regions in direct contact with a first fin structure in the first device region and in direct contact with a second fin structure in the second device region, in accordance with the present disclosure.

FIGS. 9 and 10 depict one embodiment of forming gate structures 320 and source and drain regions in direct contact with each of the plurality of first fin structures 305a in the first device region 50 and each of the plurality of second fin structure 305b in the second device region 55. In one embodiment, each gate structure 320 includes a gate dielectric 321 in contact with at least the fin structure 30a, 30b, a gate conductor 322 on the gate dielectric 321, and a gate dielectric cap 324 on the gate conductor 322. The gate structure 320 may be formed by forming blanket material layers for the gate dielectric 321, gate conductor 322, and gate dielectric cap 324 to provide a gate stack, and patterning and etching the gate stack to provide the gate structures 320. The gate structures 320 can be formed utilizing photolithography and etch process steps.

Referring to FIG. 9, The gate dielectrics 321 are typically positioned on at least a portion of the sidewalls of the fin structures 305a, 305b, but may also be formed in direct contact with the upper surface of the fin structures 305a, 305b. The gate dielectrics 321 may be formed by a thermal growth process such as, for example, oxidation, nitridation or oxynitridation. The gate dielectrics 321 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes.

The gate dielectrics 321 may be comprised of an insulating material having a dielectric constant of 4.0 or greater. In another embodiment, the gate dielectrics 321 are comprised of an insulating material having a dielectric constant greater than 7.0. The dielectric constants mentioned herein are relative to a vacuum at room temperature. In one embodiment, the gate dielectrics 321 employed in the present invention includes, but is not limited to: an oxide, nitride, oxynitride and/or silicates including metal silicates, aluminates, titanates and nitrides. In one example, when the gate dielectrics 321 are comprised of an oxide, the oxide may be selected from the group including, but not limited to $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of each of the gate dielectrics 321 may vary, but typically, the gate dielectric 321 has a thickness ranging from 1 nm to 10 nm. In another embodiment, each of the gate dielectric 321 may have a thickness ranging from 1 nm to 3 nm.

Referring to FIG. 10, after forming the gate dielectrics 321, and the gate conductors 322 of the gate structures 320 are formed atop the gate dielectrics 321 utilizing a deposition process, such as physical vapor deposition (PVD), CVD or evaporation. Although FIG. 10 depicts a gate structure 320 being formed on only one fin structure 305a in the first device region 50 of the SOI substrate 90, and depicts a gate structure 320 being formed on only one fin structure 305b in the second device region 55 of the SOI substrate 90, the present disclosure is not limited to only this embodiment, as any number of fin structures may be present in the first and second device regions 50, 55 of the SOI substrate 90.

The gate conductors 322 may be composed of polysilicon, SiGe, a silicide, a metal or a metal-silicon-nitride, such as Ta—Si—N. Examples of metals that can be used as the gate conductor 322 include, but are not limited to Al, W, Cu, Ti or other like conductive metals. In one embodiment, the gate conductor 322 comprises Ti, Zr, Hf, V, Nb, Ta, TiN, TaN or a combination thereof. The gate conductor 322 may be doped or undoped. The physical thickness of the gate conductor 322 may range from 1 nm to 10 nm. In another embodiment, the gate conductor 80 has a thickness ranging from 1 nm to 3 nm.

The gate dielectric caps 324 may be composed of a nitride, oxide, oxynitride material, and/or any other suitable dielectric layer. Gate dielectric caps 324 may comprise a single layer of dielectric material or multiple layers of dielectric materials. The dielectric layer can be formed by a deposition process, such as chemical vapor deposition (CVD) and/or atomic layer deposition (ALD). Alternatively, the gate dielectric caps 324 may be formed using a growth process, such as thermal oxidation or thermal nitridation. The gate dielectric caps 324 may have a thickness ranging from 1 nm to 100 nm. In one embodiment, the gate dielectric cap 324 is composed of a nitride, such as SiN, that is formed by chemical vapor deposition to a thickness on the order of 25 nm to 50 nm.

FIG. 10 further depicts forming a first spacer 323 in direct contact with the gate structures 320. The first spacer 323 may be formed by depositing a conformal layer of dielectric material, such as oxides, nitrides or oxynitrides followed by etching. The first spacer 323 may have a width ranging from 1 nm to 10 nm, typically ranging from 1 nm to 5 nm.

In some embodiments, following the formation of the first spacer 323, source and drain regions may then be formed on the exposed sidewalls of the fin structure 305a, 305b. The source and drain regions can be formed in the fin structures 305a, 305b on opposing sides of the gate structures 320 using ion implantation. In another embodiment, the source and drain regions may be formed by forming an insitu doped material on the exposed portions of the fin structures 305a, 305b and diffusing dopant from insitu doped material into the sidewalls of the fin structures 305a, 305b. In one embodiment, the source and drain regions of the fin structures 305a that are present in the first device region 50 may by doped to an n-type conductivity when the first semiconductor material of the fin structure 305a in the first device region 50 is composed of silicon. In this embodiment, the finFET device that is formed in the first device region 50 is an n-type finFET 400. In one embodiment, the source and drain regions that are present in the second device region 55 may be doped to a p-type conductivity when the second semiconductor layer 310 on the second fin structure 305b is silicon germanium. In this embodiment, the finFET device that is formed in the second device region 55 is a p-type finFET 300. Each of the first and second device regions 50, 55 may be selectively processes using block masks, such as a photoresist block masks.

In the embodiments, in which a p-type finFET device 300 is formed on a second semiconductor layer 310 of silicon germanium that is in direct contact with an etched portion of a fin structure 305b composed of silicon, the silicon germanium material that provides the channel region of the device provides increased mobility, threshold voltage control and strain based performance enhancements.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A finFET semiconductor device comprising:
a first fin structure of a first portion of a first semiconductor layer comprising a first semiconductor material having a width ranging from 1.0 nm to 5.0 nm;
a second semiconductor material directly on an upper surface and sidewalls of the first fin structure, wherein the second semiconductor material is a conformal epitaxial material having a vertical thickness on said upper surface that is the same as a lateral thickness on said sidewalls of the first fin structure;
a second fin structure of a second portion of said first semiconductor layer, wherein said second fin structure comprises said first semiconductor material, and wherein a topmost surface of said first semiconductor material of said second fin structure is coplanar with a topmost surface of said second semiconductor material on said upper surface of said first fin structure;
a first gate structure present on a portion of the second semiconductor material of said first fin structure;
a second gate structure present on a portion of said first semiconductor material of said second fin structure; and
source and drain regions on opposing sides of said first and said second gate structures.

2. The finFET semiconductor device of claim 1, wherein the first semiconductor material is silicon, and the second semiconductor material is silicon germanium.

3. The finFET semiconductor device of claim 1, wherein said first semiconductor material is silicon, and said second semiconductor material is germanium.

4. The finFET semiconductor device of claim 1, wherein said first semiconductor material is silicon, and said second semiconductor material is silicon doped carbon.

5. The finFET semiconductor device of claim 4, wherein said silicon doped carbon includes 0.3 percent to 5 percent carbon.

6. The finFET semiconductor device of claim 1, wherein said first fin structure and said second fin structure have a bottommost surface in direct physical contact with a topmost surface of an insulator layer.

7. The finFET semiconductor device of claim 1, wherein said second semiconductor material has a defect density of less than 100 cm$^{-2}$.

8. The finFET semiconductor device of claim 1, wherein said second semiconductor material has a same crystal orientation as said first semiconductor material.

9. The finFET semiconductor device of claim 1, wherein said first gate structure and said second gate structure comprise, from bottom to top, a gate dielectric and a gate conductor.

10. The finFET semiconductor device of claim 1, further comprising a spacer located on sidewalls of said first gate structure and said second gate structure.

* * * * *